(12) United States Patent
Margomenos et al.

(10) Patent No.: US 9,379,680 B1
(45) Date of Patent: Jun. 28, 2016

(54) SYSTEMS, METHODS, AND APPARATUS FOR A POWER AMPLIFIER MODULE

(71) Applicant: The Boeing Company, Chicago, IL (US)

(72) Inventors: Alexandros D. Margomenos, Pasadena, CA (US); Miroslav Micovic, Thousand Oaks, CA (US); Ara K. Kurdoghlian, La Canada, CA (US); Ross L. Bowen, Simi Valley, CA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 14/071,756

(22) Filed: Nov. 5, 2013

(51) Int. Cl.
*H03F 3/68* (2006.01)
*H03F 3/60* (2006.01)

(52) U.S. Cl.
CPC ........................................ *H03F 3/602* (2013.01)

(58) Field of Classification Search
USPC ........................... 330/295, 124 R, 84, 286, 53
See application file for complete search history.

(56) References Cited

U.S. PATENT DOCUMENTS

| | | | |
|---|---|---|---|
| 5,208,554 A * | 5/1993 | Endler et al. ................... | 330/295 |
| 6,639,461 B1 | 10/2003 | Tam et al. | |
| 6,714,169 B1 | 3/2004 | Chau et al. | |
| 7,026,869 B2 | 4/2006 | Merenda et al. | |
| 7,248,118 B2 | 7/2007 | Ohnishi et al. | |
| 7,477,108 B2 | 1/2009 | Ichitsubo et al. | |
| 7,904,029 B2 * | 3/2011 | Brady et al. ..................... | 455/78 |
| 2012/0049952 A1 * | 3/2012 | Ng ................................. | 330/126 |

\* cited by examiner

*Primary Examiner* — Hieu Nguyen
(74) *Attorney, Agent, or Firm* — Kwan & Olynick LLP

(57) ABSTRACT

Systems, methods, and apparatus are disclosed for wideband power amplification in a platform, such as an airplane. An amplifier module may include a first amplification stage. The first amplification stage may comprise a first plurality of amplification circuits. The amplifier module may also include a first plurality of couplers configured to couple an input port to each amplification circuit of the first amplification stage. The amplifier module may include a second amplification stage comprising a second plurality of amplification circuits. The amplifier module may also include a second plurality of couplers configured to couple the first amplification stage to the second amplification stage. The amplifier module may include a third plurality of couplers configured to combine an output of each amplification circuit of the second plurality of amplification circuits into an output signal. The third plurality of couplers may comprise one or more Lange couplers.

20 Claims, 10 Drawing Sheets

SYSTEMS, METHODS, AND APPARATUS FOR A POWER AMPLIFIER MODULE

TECHNICAL FIELD

This disclosure generally relates to system, apparatus and methods for assembling wideband, high power amplifier radio frequency (RF) modules.

BACKGROUND

A power amplifier module may be an electronics component configured to increase the power of a given signal. Thus, the power amplifier module may receive an input signal at an input port, and provide an amplified output signal at an output port. A power amplifier module may be used to amplify a signal that is transmitted from one or more communications, radar or other radio frequency (RF) systems on a platform (aircraft, vehicle, unmanned aerial vehicle, ship, and the like). Conventional power amplifier modules remain limited because they are narrow band amplifiers that operate in a narrow frequency range. Moreover, conventional power amplifier modules are not able to tolerate significant mismatches that may occur during various operational conditions of one or more antennae or other components of the platform.

SUMMARY

Disclosed herein are systems, methods, and apparatus for wideband power amplification of radio frequency (RF). The wideband power amplifier module may include one or more amplification stages used to amplify an input signal. The wideband power amplifier module may also include one or more pluralities of couplers, which may be Lange couplers, to route signals within the wideband power amplifier module and combine the amplified output into a single output signal. The wideband power amplifier module may include or be implemented in a module configured to suppress parasitic resonances and dissipate thermal energy generated by the wideband power amplifier.

Thus, according to some embodiments, a wideband power amplifier module is disclosed. The wideband power amplifier module may comprise: an input port configured to receive an input signal for transmission from a platform; a first amplification stage of the wideband power amplifier module, the first amplification stage comprising a first plurality of amplification circuits; a first plurality of couplers configured to couple the input port to each amplification circuit of the first amplification stage; a second amplification stage of the wideband amplifier module, the second amplification stage comprising a second plurality of amplification circuits; a second plurality of couplers configured to couple the first amplification stage to the second amplification stage; a third plurality of couplers configured to combine an output of each amplification circuit of the second plurality of amplification circuits into an output signal, the third plurality of couplers comprising one or more Lange couplers; and an output port configured to receive the output signal generated by the third plurality of couplers and further configured to provide the output signal to a transmission device of the platform.

In some embodiments, the first amplification stage comprises four amplification circuits, and the second stage comprises eight amplification circuits. In various embodiments, the first amplification stage, the first plurality of couplers, the second amplification stage, the second plurality of couplers, and the third plurality of couplers collectively have over an octave of bandwidth. For example, the first amplification stage, the first plurality of couplers, the second amplification stage, the second plurality of couplers, and the third plurality of couplers collectively have a bandwidth of 5 gigahertz to 50 gigahertz or, more specifically, of 9 gigahertz to 18 gigahertz. In particular embodiments, the first plurality of couplers and the second plurality of couplers comprise Lange couplers. Furthermore, an isolation port of each Lange coupler may be coupled to an electrical ground via a resistor, and may be configured to absorb a signal reflection. In some embodiments, the first amplification stage, the first plurality of couplers, the second amplification stage, the second plurality of couplers, and the third plurality of couplers are included in a housing module, wherein the housing module comprises a package and a lid, and wherein the housing module is configured to absorb parasitic resonances and thermal energy associated with the wideband power amplifier. In various embodiments, a first top surface of the first amplification stage and a second top surface of the second amplification stage are implemented at the same height within the housing module.

In some embodiments, the wideband power amplifier module further comprises: a first bias board configured to bias the first amplification stage; a first conductive board implemented above the first bias board; a second bias board configured to bias the second amplification stage; and a second conductive board implemented above the second bias board, wherein the first plurality of couplers is implemented above the first conductive board, and wherein the second plurality of couplers is implemented above the second conductive board. In some embodiments, the first conductive board and the second conductive board are comprised of a material selected from the group consisting of: alumina, quartz, and silicon, and the first conductive board and the second conductive board each have a thickness of 500 microns. In various embodiments, the module is made of a material selected from the group consisting of a controlled expansion (CE) alloy, a copper-tungsten alloy, copper, aluminum silicon carbide, and aluminum. In particular embodiments, the input port is coupled to a radar or communications antenna of a platform, and the input signal is received from the antenna of the platform. In some embodiments, the transmission device is an antenna of a platform.

Further disclosed herein is a method for wideband power amplification, the method comprising: receiving an input signal at an input port of a wideband power amplifier module; providing the input signal to a first amplification stage comprising a first plurality of amplification circuits, the input signal being provided to each amplification circuit of the first plurality of amplification circuits; generating a first plurality of amplified signals by amplifying the input signal by a first gain; providing the first plurality of amplified signals to a second amplification stage comprising a second plurality of amplification circuits, an amplified signal of the first plurality of amplified signals being provided to each amplification circuit of the second plurality of amplification circuits; generating a second plurality of amplified signals by amplifying the first plurality of amplified signals by a second gain; and generating an output signal by combining the second plurality of amplified signals into a single output signal via Lange couplers.

In some embodiments, Lange couplers are used to provide the input signal to the first amplification stage and to provide the first plurality of amplified signals to the second amplification stage. In various embodiments, the Lange couplers are implemented on a plurality of conductive boards comprised of alumina. In some embodiments, the method may further comprise providing the output signal to an antenna via an output port. The method may also further comprise: receiving a reflected signal at the output port; and using at least one Lange coupler to absorb the reflected signal.

Also disclosed herein is a system for wideband power amplification of a signal transmitted from a platform, the system comprising: a transmission device configured to generate an input signal for transmission from the airplane; an input port configured to receive the input signal generated by the transmission device; a first amplification stage of a wideband power amplifier module, the first amplification stage comprising a first plurality of amplification circuits; a first plurality of couplers configured to couple the input port to each amplification circuit of the first amplification stage; a second amplification stage of the wideband amplifier module, the second amplification stage comprising a second plurality of amplification circuits; a second plurality of couplers configured to couple the first amplification stage to the second amplification stage; a third plurality of couplers configured to combine an output of each amplification circuit of the second plurality of amplification circuits into an output signal, the third plurality of couplers comprising one or more Lange couplers; an output port configured to receive the output signal generated by the third plurality of couplers; and an antenna coupled to the output port and configured to transmit the output signal from the platform.

DETAILED DESCRIPTION

In the following description, numerous specific details are set forth in order to provide a thorough understanding of the presented concepts. The presented concepts may be practiced without some or all of these specific details. In other instances, well known process operations have not been described in detail so as to not unnecessarily obscure the described concepts. While some concepts will be described in conjunction with the specific examples, it will be understood that these examples are not intended to be limiting.

Conventional high power amplifier modules used in platforms, such as aircrafts, typically utilize narrowband amplifiers. These modules are limited in part by the use of narrowband power amplifier chips and power combiners, such as Wilkinson power combiners, reactive couplers, and junction couplers. Moreover, conventional power amplifier modules do not provide the ability to bias and house chips without generating parasitic resonances which interfere with operation of the module at the frequencies of operation desired for RF transmissions. Furthermore, conventional power amplifier modules do not have the ability to absorb internal signal reflections which may arise due to mismatches, such as impedance mismatches. As a result, the reflected signal may be reflected back to the power amplifier itself and overload and damage the internal circuitry of the power amplifier module.

Various systems, methods, and apparatus are disclosed herein that provide a wideband power amplifier module that is configured to suppress resonances, dissipate thermal energy, and absorb reflected signals. In various embodiments, amplification stages may include wideband amplification circuits that are used to sequentially amplify an input signal. The output of the amplification stages may be combined by a power combiner or combination circuit which may combine the output of the wideband amplification circuits into a single amplified output signal. In various embodiments, Lange couplers are used to couple the amplification stages as well as combine their outputs. The Lange couplers may be configured for a wide bandwidth of operation, and may be further configured to absorb reflected signals. Thus, the use of wideband amplification circuits and Lange couplers may provide a very wide frequency of operation (which may be 9 GHz to 18 GHz) as well as absorb reflected signals to protect the internal circuitry of the wideband power amplifier. Moreover, the arrangement of the components of the wideband power amplifier module and the design of a module used to house the wideband power amplifier may be configured to suppress parasitic resonances across the entire range of operation of the wideband power amplifier.

Figure 1:
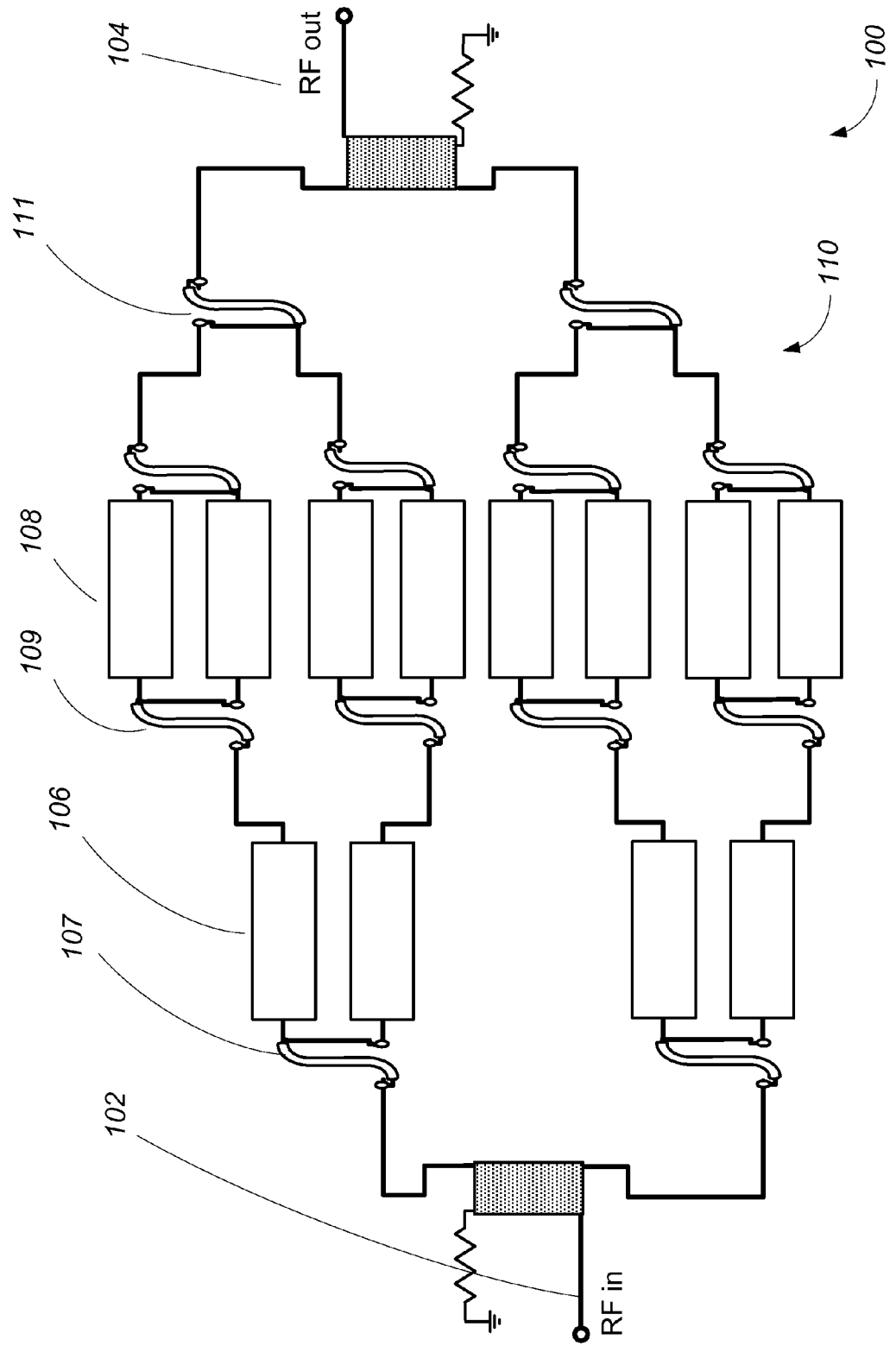
FIG. 1 illustrates an example of a power amplifier module, in accordance with some embodiments.

FIG. 1 illustrates an example of a power amplifier module, in accordance of some embodiments. Power amplifier module 100 may be implemented in a platform, such as an airplane or an unmanned aerial vehicle. Thus, power amplifier module 100 may include input port 102 configured to receive an electronic signal from one or more systems of the platform. For example, input port 102 may receive a signal from a communications system, a radar array, or an avionics system of the platform. Power amplifier module 100 may include one or more components configured to amplify the input signal received at input port 102, and further configured to provide the amplified signal as an output signal at output port 104. The output signal may be provided to another component of the platform for use by that component. For example, the output signal may be provided to an antenna for transmission from the platform. In various embodiments, power amplifier module 100 uses Lange couplers to couple components included within power amplifier module 100. In this way, power amplifier module 100 is able to amplify a wideband of frequencies, and has the ability to easily handle large impedance mismatches and internal signal reflections which may occur during operation of power amplifier module 100.

Accordingly, power amplifier module 100 may include first amplification stage 106 which may include a first plurality of amplification circuits configured to amplify the input signal by a first gain. The amplification circuits may be wideband integrated circuits, such as monolithic microwave microwave circuits (MMICs), configured to amplify a received signal by a predetermined gain. In some embodiments, the MMICs may be wideband gallium nitride (GaN) MMICs. Power amplifier module 100 and first amplification stage 106 may be configured to suppress resonance characteristics of the amplification circuits, as discussed in greater detail below with reference to FIG. 3 and FIG. 4. As shown in FIG. 1, first amplification stage 106 includes four amplification circuits. Each of the four amplification circuits is coupled to input port 102. Thus, each amplification circuit receives an input signal received at input port 102 and amplifies the received input signal by a gain determined based on a configuration of the amplification circuit.

Accordingly, first amplification stage 106 may be coupled to input port 102 via first plurality of couplers 107. In various embodiments, first plurality of couplers 107 includes multiple Lange couplers, where each Lange coupler of first plurality of couplers 107 couples input port 102 to an amplification circuit included in first amplification stage 106. A Lange coupler may be an electrical component that provides a 4 port network having one input port coupled to two output ports having a 90 degree phase difference. The Lange coupler may also have an isolation port which, according to various embodiments, has been coupled to an electrical ground via a resistor which may be a thin film resistor. Accordingly, each Lange coupler included in first plurality of couplers 107 may have an input port coupled to input port 102, and may have output ports coupled to amplification circuits of first amplification stage 106. For example, a first Lange coupler may have an input port coupled to input port 102 and may also have a first output coupled to a first amplification circuit and a second output coupled to a second amplification circuit. In this way, the Lange couplers included in first plurality of couplers 107 may couple input port 102 to the amplification circuits included in first amplification stage 106.

Furthermore, the couplers included in first plurality of couplers 107 may be fabricated on low-loss substrates, such as polished alumina, quartz, or silicon. The use of low loss substrates minimizes the radio frequency (RF) losses caused by the couplers during operation because the use of a thicker substrate leads to wider traces for microstrips included in the couplers. The use of wider microstrips results in lower conductor losses. Moreover, the use of Lange couplers results in a wide bandwidth of operation, compact size, and excellent return loss characteristics. Furthermore, because of the resistor, which may be a thin film resistor, coupled to the isolation port, the Lange couplers may absorb any potential signal reflections which may result due to impedance mismatches. Reflections may be caused not just by impedance mismatches, but by amplitude and phase mismatches as well. Such reflections may be caused by mismatches between the amplification circuits themselves, or between power amplifier 100 and other components implemented within the vehicle.

For example, reflections may occur at output port 104 when power amplifier module 100 is coupled to an antenna. The input impedance of the antenna may vary significantly based on: bandwidth; changes in the environment; effects of random environmental conditions; and when the antenna is scanning because there may be changes in mutual impedance between antenna elements in an electronically scanned array. In one example, the antenna of the platform may be lost completely, thus resulting in an open circuit and an extreme mismatch in impedance at output port 104. Due to the use of Lange couplers and the resistor coupled to the isolation port, the reflections which may occur at output port 104 may be absorbed by Lange couplers included in power amplifier module 100 and damage to the MMICs included in power amplifier module 100 may be avoided.

Power amplifier module 100 may also include second amplification stage 108, which may be configured to amplify an output of first amplification stage 106 by a second gain. As similarly discussed above with reference to first amplification stage 106, second amplification stage 108 may include a second plurality of amplification circuits, which may also be MMICs. The amplification circuits included in the second plurality of amplification circuits may be configured to amplify an output of the first plurality of amplification circuits, thus providing an additional stage of amplification to the signal originally received at input port 102. As illustrated in FIG. 1, second amplification stage 108 may include eight amplification circuits. Thus, an output of each of the first plurality of amplification circuits may be coupled to an input of two amplification circuits of the second plurality of amplification circuits.

Accordingly, second power amplification stage 108 may be coupled to first amplification stage 106 via second plurality of couplers 109. As similarly discussed above with reference to first plurality of couplers 107, second plurality of couplers 109 may include Lange couplers. Each Lange coupler included in second plurality of Lange couplers 109 may couple an output of an amplification circuit of first amplification stage 106 to the inputs of two amplification circuits of second amplification stage 108. In this way, the output of first amplification stage 106 may be coupled to the input of second amplification stage 108 to provide additional amplification to the input signal received at input port 102.

Power amplifier module 100 may further include combination circuit 110, which may be a power combiner comprised of third plurality of couplers 111. Combination circuit 110 may combine the outputs of the second plurality of amplification circuits into a single amplified output. In this way, the input signal that was initially received at input port 102, and subsequently split and amplified by first and second pluralities of couplers 107 and 109 and first and second amplification stages 106 and 108 may be combined to generate a single amplified output signal. Accordingly, third plurality of couplers 111 may include several couplers, which may be Lange couplers, which are arranged to sequentially combine the outputs of second plurality of amplification circuits 109. For example, as shown in FIG. 1, the outputs of two amplification circuits of second stage 108 may be coupled to a single Lange coupler of third plurality of couplers 111, and combined into a single output. This may be done for each output of each amplification circuit of second amplification stage 108. In various embodiments, third plurality of couplers 111 may be arranged in two combination stages such that the outputs of couplers are combined to generate a single amplified output signal at output port 104.

It will be appreciated that while power amplifier module 100 includes two amplification stages having four and eight amplification circuits respectively, any number of amplification circuits and any number of amplification stages may be used to achieve amplification of the input signal. In various embodiments, the relationship between the number of amplification circuits included in a first amplification stage and the number of amplification circuits included in a subsequent amplification stage will be $2^N$. Moreover, it will be appreciated that different circuits with different gain characteristics may be used.

Figure 2A:
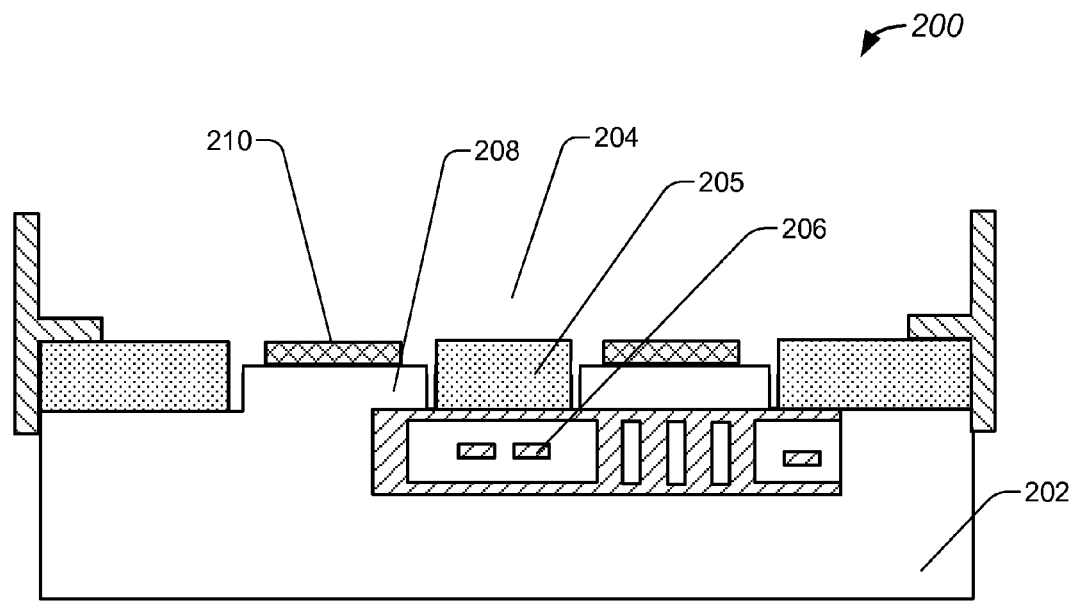
FIG. 2A illustrates an example of a module configured to house and bias a power amplifier, implemented in accordance with some embodiments.

FIG. 2A illustrates an example of a module configured to house and bias a power amplifier, implemented in accordance with some embodiments. Module 200 may be a housing module configured to minimize parasitic resonances that may occur during operation of the power amplifier implemented within module 200, thus achieving excellent RF performance characteristics. Moreover, module 200 may be configured to disperse heat and thermal energy generated during operation, thus achieving excellent thermal management during operation of the power amplifier implemented within module 200. Thus, one or more components of module 200 may be configured to achieve excellent RF performance and thermal management of the specific power amplifier implemented within module 200.

Accordingly, module 200 may include package 202 which may be configured to house various components included in the power amplifier as well as various components which may be used to bias or power the power amplifier. For example, package 202 may be configured to have one or more wells or pockets that each houses a bias line, such as bias line 204, which may include a conductive board, such as board 205, and a bias board, such as bias board 206. Package 202 may be further configured to include pedestals, such as pedestal 208, which may be made of a metal, such as GaN, and configured to provide structural support for an amplification circuit, such as amplification circuit 210. Thus, an amplification circuit may be implemented on and be coupled to a pedestal of package 202. In various embodiments, package 202 may be configured such that the top of each bias line and the top of each amplification circuit are at the same height. Thus, the depths of the wells included in package 202 and the height of the pedestals included in package 202 may be determined based on a thickness of the bias lines as well as the thickness of the amplification circuits, respectively. For example, a board may be 500 microns thick while an amplification circuit may be 15 to 50 microns thick. The pockets and pedestals may be configured such that the top surface of each is at the same height despite their different thicknesses. By ensuring that the top surface of the bias lines and amplification circuits are at the same height, parasitic resonances within module 200 are reduced and suppressed.

Furthermore, the distance between amplification circuits may be configured based on their thermal characteristics. For example, amplification circuits that produce more heat during operation may be placed farther apart. Moreover, the use of Lange couplers to couple the amplification circuits suppresses parasitic resonances which may otherwise occur when the distance between amplification circuits is increased.

As previously mentioned, module 202 may include bias lines which may include bias boards, which may be printed circuit boards, and conductive boards. In some embodiments, various bias lines of module 202 may be used to bias couplers included in the power amplifier implemented within module 200. Thus, bias lines, such as bias line 204, may be implemented to generate additional bias lines that may be used to bias the amplification circuits included in the power amplifier implemented within module 200. Accordingly, bias line 204 may include a bias board, such as bias board 206, which may be used to route power within module 200, as discussed in greater detail with reference to FIG. 2B. As previously discussed, bias line 204 may also include a conductive board, such as board 205, which may be a conductive piece of metal, such as alumina, that is placed on top of each bias board and is electrically coupled to each bias board, thus providing heat dissipation of heat which may be generated within the bias boards during operation of the amplification circuits, which may be upwards of 150 degrees Celsius.

Figure 4:
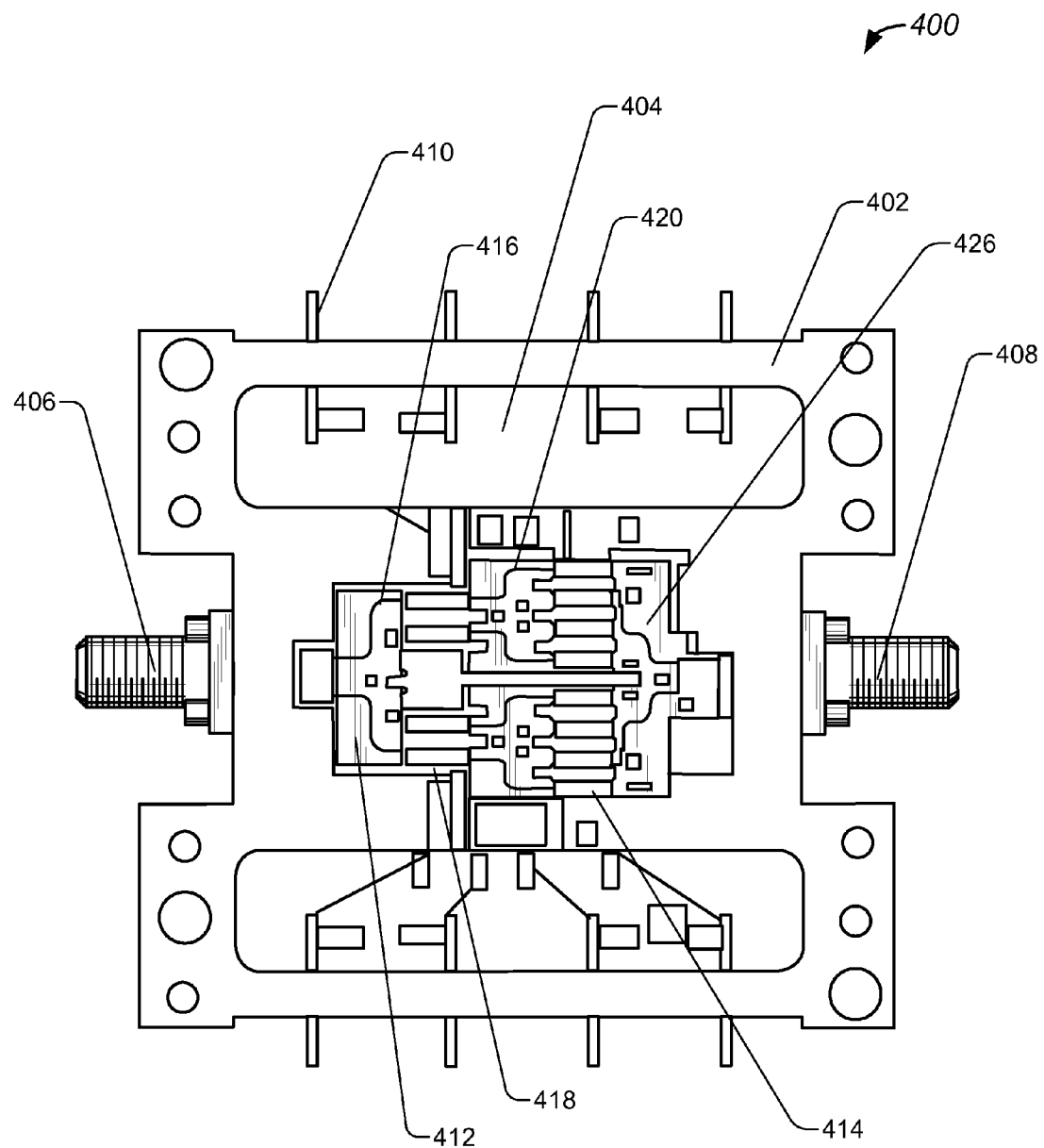
FIG. 4 illustrates an example of a package configured to house a power amplifier, implemented in accordance with some embodiments.

Furthermore, the couplers used to couple the amplification circuits included in the power amplifier of module 202 may be implemented on top the boards, as illustrated in greater detail in FIG. 4. Thus, the boards may be configured to be a substrate for implementation of the couplers, and may provide thermal management and heat dissipation for each coupler in the power amplifier, as well as affect performance and loss characteristics associated with each coupler. Accordingly, a conductive board, such as board 205, may be configured based on the thermal, electrical, and performance characteristics of a coupler used in the power amplifier. For example, if a coupler is 8 microns thick, board 205 may be configured to be 500 microns thick to achieve efficient heat dissipation with minimal signal loss.

Figure 2B:
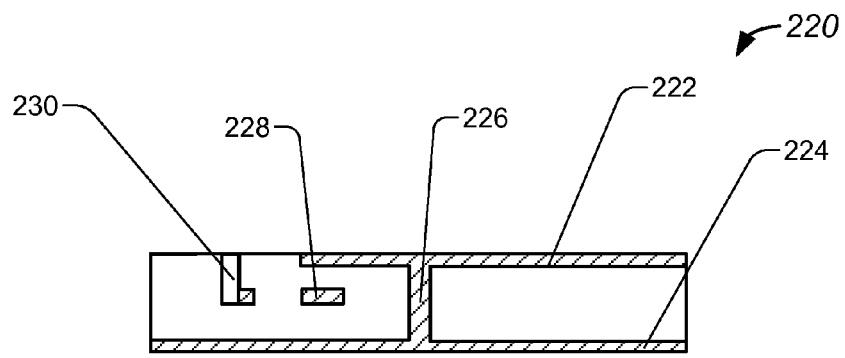
FIG. 2B illustrates a detailed view of a printed circuit board that may be used as a bias board, implemented in accordance with some embodiments.

FIG. 2B illustrates a detailed view of a printed circuit board that may be used as a bias board, implemented in accordance with some embodiments. As previously discussed with reference to FIG. 2A, a bias line may include various bias boards which may be used to route bias lines within module 200 to provide power to one or more components of the power amplifier implemented within module 200. As shown in FIG. 2B, a bias line may be implemented in a printed circuit board (PCB), and vias may be used to couple different portions of the PCB. For example, PCB 220 may include first metal portion 222 and second metal portion 224 which may be coupled by through via 226. In some embodiments, first metal portion 222 may be in contact with or coupled to an amplification circuit or a conductive board. Moreover, first metal portion 222 may be coupled to third metal portion 228 by blind via 230. Third metal portion 228 may be coupled to a power source and used to route power and bias PCB 220. It will be appreciated that while a PCB has been described and shown, any electrical circuit is contemplated and disclosed herein.

Figure 2C:
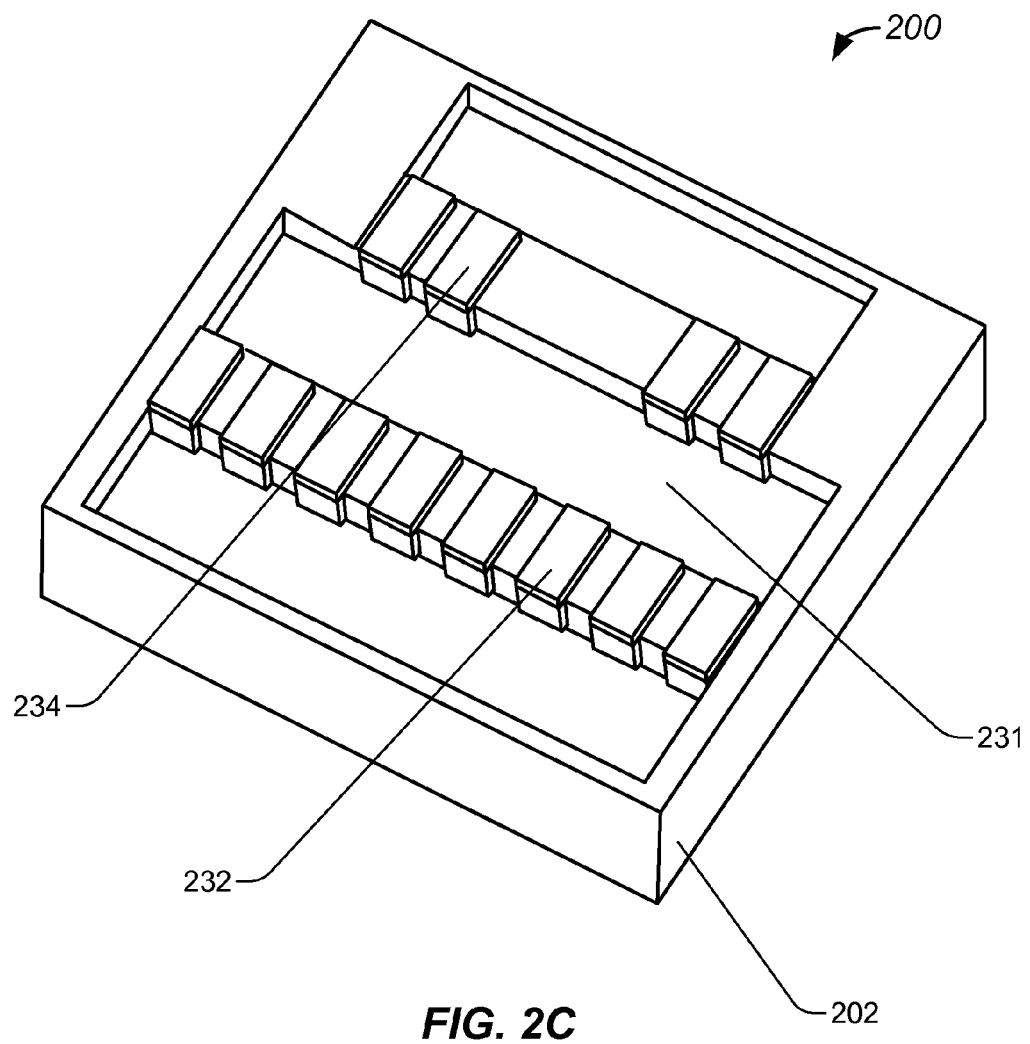
FIG. 2C illustrates a top view of a module configured to house a power amplifier, implemented in accordance with some embodiments.

FIG. 2C illustrates a top view of a module configured to house a power amplifier, implemented in accordance with some embodiments. As previously discussed, module 200 may be a housing module configured to include package 202, which may have various pockets and pedestals to house, among other components, bias lines and amplification circuits, respectively. As shown in FIG. 2C, package 202 may be fabricated to have pockets, such as pocket 231, which have one or more dimensions configured based on thermal and performance characteristics of the amplification circuits and couplers included in the power amplifier implemented within module 200.

FIG. 2C further illustrates amplification circuits implemented on pedestals within module 200. For example, first plurality of amplification circuits 232 may be used as a first stage of the power amplifier. In this instance, first plurality of amplification circuits 232 includes four amplification circuits. Furthermore, second plurality of amplification circuits 234 may be used as a second stage of the power amplifier. In this instance, second plurality of amplification circuits 234 includes eight amplification circuits. While not shown in FIG. 2C, as will be discussed in greater detail below with reference to FIG. 4, bias boards and conductive boards may be placed within the pockets, and couplers may be implemented on top of the boards to couple the first and second stage of the power amplifier.

Figure 3:
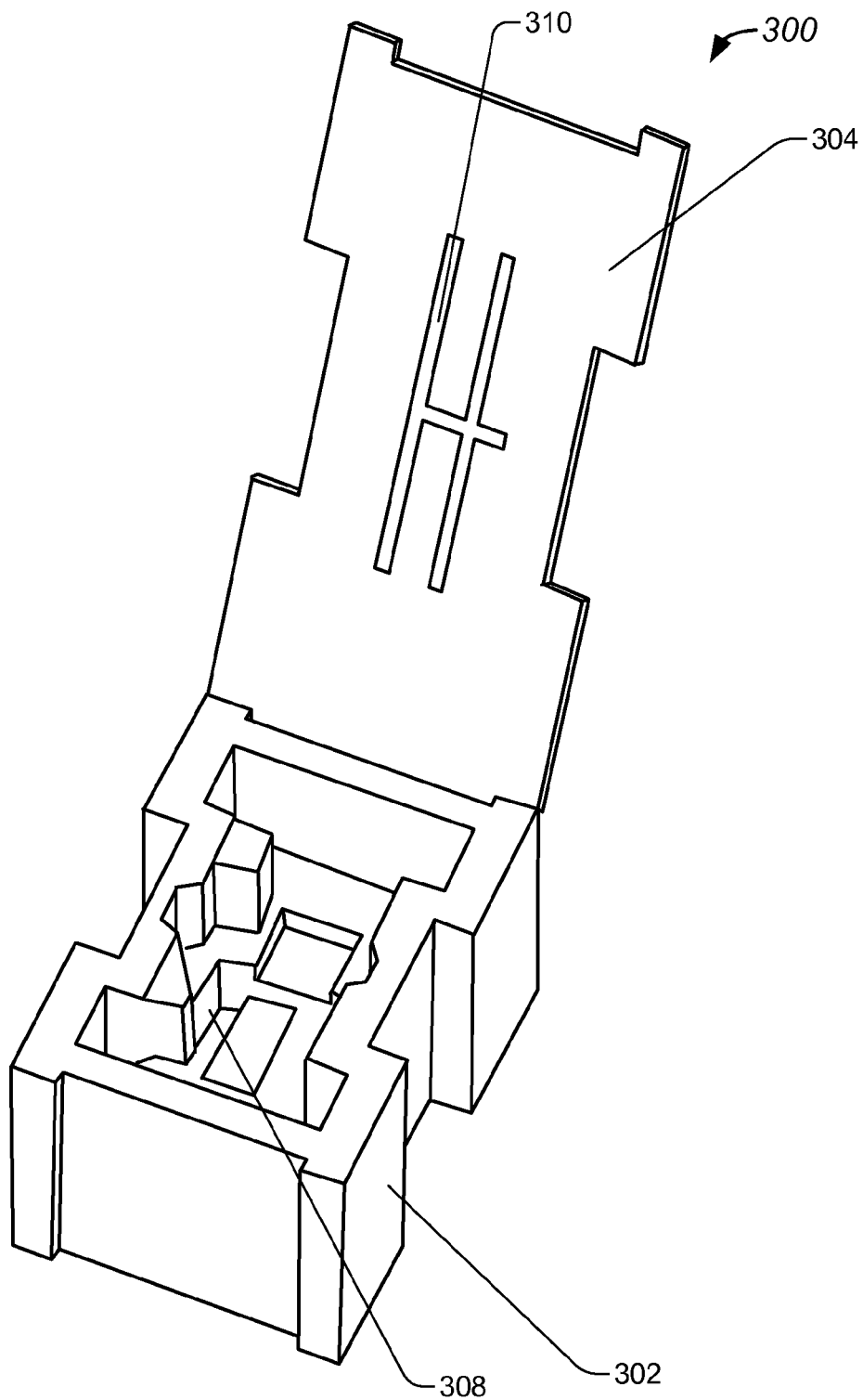
FIG. 3 illustrates an example of a module that may be used to house a power amplifier, implemented in accordance with some embodiments.

FIG. 3 illustrates an example of a module that may be used to house a power amplifier, implemented in accordance with some embodiments. Module 300 may be a housing module configured to include package 302 and lid 304 which fits on top of package 302 to create an enclosed cavity. As similarly discussed above with reference to FIGS. 2A-2C, package 302 may provide structural support for and house a power amplifier as well as various structures which may be used to bias the power amplifier, suppress parasitic capacitances produced during operation of the power amplifier, as well as dissipate heat generated by the power amplifier. Package 302 may include a coupler or connector which may be used to couple components implemented within package 302 to external components. For example, a connector, such as a K-connector, may be used as an input port, and may be configured to receive an input signal, which may be an RF signal, from an external signal source. In operation, the external signal source may be a component or system of a vehicle, such as an airplane. Another connector may be used to provide an output at an output port. In some embodiments, feed throughs may be used to couple internal bias lines to an external power source, which may be a DC power source.

In various embodiments, module 300 is configured to suppress resonances during a wideband of operation, which may be at least 9-18 GHz. Thus, in addition to previously mentioned configured parameters, module 300 may include an internal faraday cage which may include first plurality of walls and posts 308 implemented in package 302, and further include second plurality of walls and posts 310 implemented in lid 304. Module 300 may be configured to include these structures as well as the power amplifier, while minimizing the amount of space, or footprint, occupied by module 300. In some embodiments, module 300 may have external dimensions (in inches) of 1.5W×1.3L×0.6H. Ordinarily, a cavity having these dimensions and operating at these frequencies would have a narrow band of operation because the power amplifier would experience a first cavity resonance at 10 GHz with multiple additional resonances at higher frequencies. However, the inclusion of the internal faraday cage as well as the configuration of module 300 suppresses these resonances during the wideband of operation.

In various embodiments, module 300 may be made of a material that has thermal and mechanical properties that may achieve sufficient thermal management to keep the components of the power amplifier implemented in module 300 below a threshold temperature, as well as having a low thermal expansion or a thermal expansion similar to silicon carbide (SiC), which may be the material used to implement the amplification circuits within the power amplifier. In some embodiments, the amplification circuits generate greater than 1 kW/cm$^2$ heat flow and operate at junction temperatures between 150 to 160 degrees Celsius. Thus, the material used for module 300 must have a high thermal conductivity, while having a thermal expansion similar to SiC and a density as low as possible to minimize the overall weight of module 300. For example plastic materials used for stereolithography or 3D printing typically reflow at temperatures around 60° C. Thus, the normal operation of the amplification circuits would cause them to reflow, thus rendering them not suitable for module 300. However, alloys, such as CE-11 and CE-13, provide high thermal conductivity, as well as a thermal expansion comparable to SiC and low weight. Thus, according to various embodiments, module 300 is made of CE-11 or CE-13. It will be appreciated that other materials may be used as well, such as copper, tungsten, a copper-tungsten alloy, aluminum silicon carbide, and aluminum.

FIG. 4 illustrates an example of a package configured to house a power amplifier, implemented in accordance with some embodiments. As similarly discussed above with reference to FIG. 3, module 400 may be a housing module configured to include package 402 which may be configured to suppress resonances and manage thermal energy generated by power amplifier 404. As shown in FIG. 4, package 402 may include input port 406, which may be a K-connector, as well as output port 408, which may also be a K-connector. Package 402 may also have pass throughs 410 which may be used to couple an external power source to bias boards (not shown in FIG. 4, but implemented underneath the conductive boards included in power amplifier 404). Bias boards and conductive boards, such as board 412, may be implemented in pockets of package 402 and amplification circuits, such as amplification circuit 414, may be implemented on pedestals of package 402.

Furthermore, as shown in FIG. 4, module 400 includes first plurality of couplers 416 implemented on board 412 and configured to couple input port 406 to first plurality of amplification circuits 418, which may be configured to provide a first stage of amplification. Module 400 may also include second plurality of couplers 420 implemented on board 422 and configured to couple first plurality of amplification circuits 418 to second plurality of amplification circuits 424, which may be configured to provide a second stage of amplification. Furthermore, module 400 may include third plurality of couplers 426 implemented on board 428 and configured to combine the outputs of each amplification circuit of second plurality of amplification circuits 424 into a single output signal. Third plurality of couplers 426 may be further configured to provide the combined output signal to output port 408. Thus, all components of power amplifier 404 may be implemented in package 402, and a lid may be placed on package 402 to seal the cavity during operation of power amplifier 404. In various embodiments, the design of module 400 may be configured to suppress resonances across a wideband of operation, such as a range from 9 GHz to 21 GHz.

Figure 5:
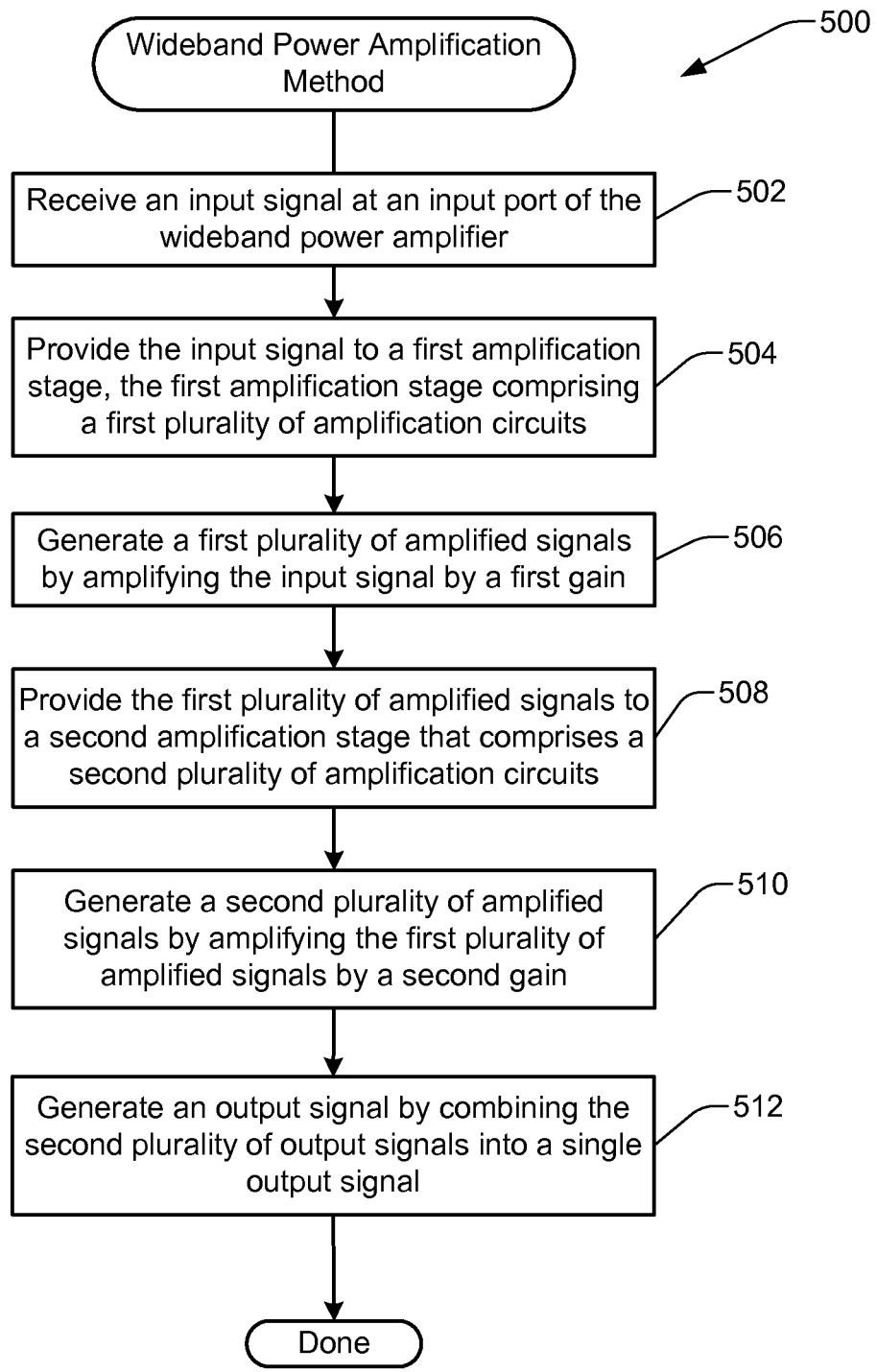
FIG. 5 illustrates a method for providing wideband power amplification of a signal, in accordance with some embodiments.

FIG. 5 illustrates a method for providing wideband power amplification of a signal, in accordance with some embodiments. As previously discussed, a wideband power amplifier module may be used in a platform, such as an airplane, to amplify various signals for transmission across a wide variety of frequencies. In some embodiments, the wideband power amplifier module may amplify signals ranging from 6 GHz to 18 GHz. The gain of the amplifier module may produce a signal with an output power of 15.5 W. The amplified signal may be provided to a transmission device, such as an antenna.

Accordingly, at step 502 an input signal may be received at an input port of the wideband power amplifier module. The input signal may be received from a component or system of the platform. For example, the input signal may be a radar signal received from a radar array. In another example, the input signal may be received from a frequency jammer used to generate local interference in communications and transmission frequencies. The input port that receives the input signal may be part of a housing or package that is part of a housing module used to house the wideband power amplifier. The input port may be electronically and communicatively coupled to internal components of the module, and may provide the input signal to the internal components.

At step 504, the input signal may be provided to a first amplification stage that comprises a first plurality of amplification circuits. In various embodiments, a first plurality of couplers may be used to couple the input port to each amplification circuit of the first plurality of amplification circuits. As previously discussed, the couplers may be Lange couplers. Thus, the input signal may be split into several signals which are each routed to a separate amplification circuit via a Lange coupler.

At step 506, a first plurality of amplified signals may be generated by amplifying the input signal by a first gain. Thus, each amplification circuit of the first plurality of amplification circuits in the first amplification stage may amplify the received signal by a first gain. In various embodiments, the first gain is determined based on one or more design parameters of the amplification circuits. Thus, the first gain may be determined by configuring the first plurality of amplification circuits when initially implementing them in the wideband power amplifier module. Each amplification circuit of the first plurality of amplification circuits may generate an amplified output signal which may collectively form the first plurality of amplified output signals.

At step 508, the first plurality of amplified signals may be provided to a second amplification stage that comprises a second plurality of amplification circuits. Each amplified output signal generated by the first plurality of amplification circuits may be split and provided to two amplification circuits of the second plurality of amplification circuits via a coupler, which may be a Lange coupler, of a second plurality of couplers. In this way, an amplified signal of the first plurality of amplified signals may be provided to each amplification circuit of the second plurality of amplification circuits.

At step 510, a second plurality of amplified signals may be generated by amplifying the first plurality of amplified signals by a second gain. Thus, the input signal initially received at step 502 may experience a second stage of amplification determined based on one or more design parameters of the second plurality of amplification circuits. In this way, each amplification circuit of the second plurality of amplification circuits may each generate an amplified output signal which may collectively form the second plurality of amplified output signals.

At step 512, an output signal may be generated by combining the second plurality of amplified signals into a single output signal via Lange couplers. Thus, a third plurality of Lange couplers may receive the second plurality of amplified signals generated by the second amplification stage and may combine the signals into a single signal. When implemented in this configuration, multiple stages of Lange couplers may be used to sequentially combine signals until a single signal is generated. For example, if two amplification stages are implemented in the wideband power amplifier module, two stages of couplers may be implemented in the third plurality of couplers that operates or functions as a power combiner or combination circuit. When implemented in this way, the ports previously described as output ports may be used as input ports, thus operating as a 2 to 1 network.

In various embodiments, the output signal generated by the third plurality of couplers may be provided to an output port of the module. The output port may be coupled to a transmission device, such as a communications antenna. The output port may provide the output signal to the transmission device, which may then transmit the output signal from the vehicle. As previously discussed, an isolation port of the Lange couplers may be coupled to ground via a resistor. In some embodiments, a reflected signal may be received at the output port, as may be the case with mismatches, such as impedance mismatches, which may occur with varying equipment and temperatures or equipment failure, such as the loss of an antenna. In such a situation, at least one of the Lange couplers may absorb the reflected signal and prevent damage to the amplification circuits.

While method 500 has been described with reference to platforms, such as airplanes that may be used in the aerospace industry it will be appreciated that the embodiments disclosed herein may be applied to any other context as well, such as automotive, railroad, and other mechanical and vehicular contexts.

Figure 6:
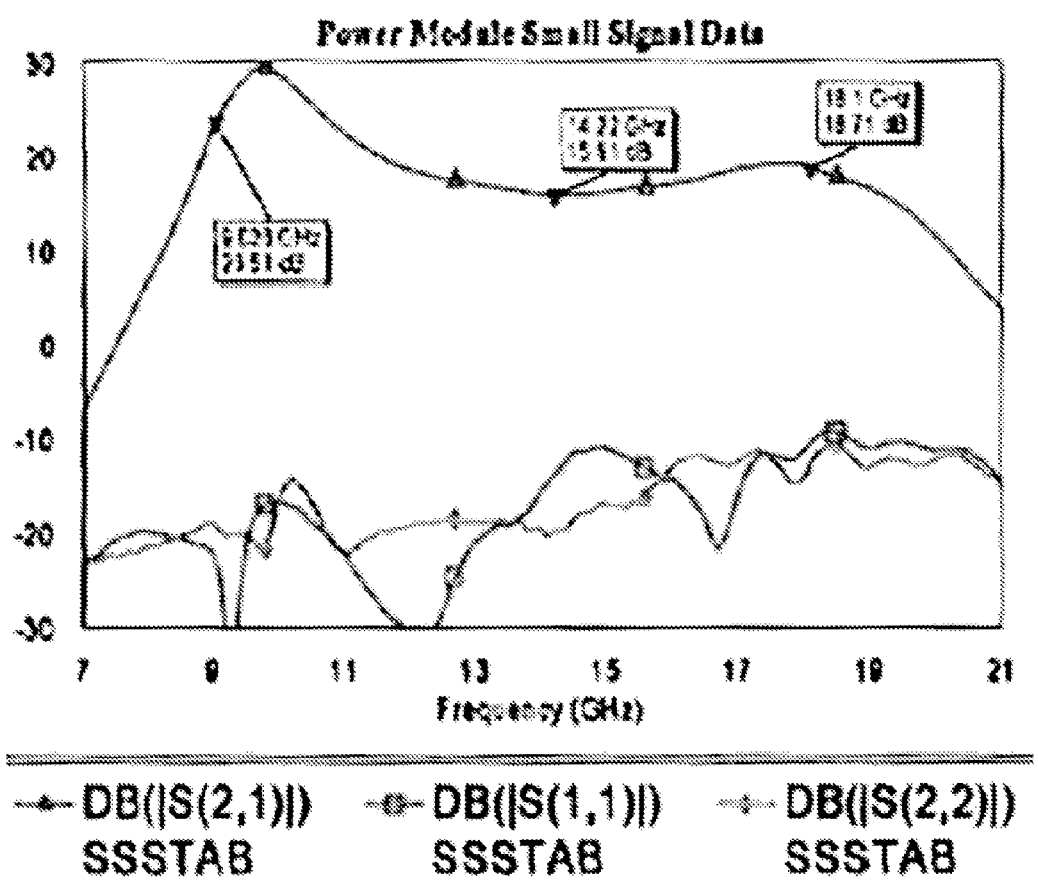
FIG. 6 illustrates an example of the performance of a power amplifier in response to receiving a small amplitude signal, in accordance with some embodiments.
Figure 7A:
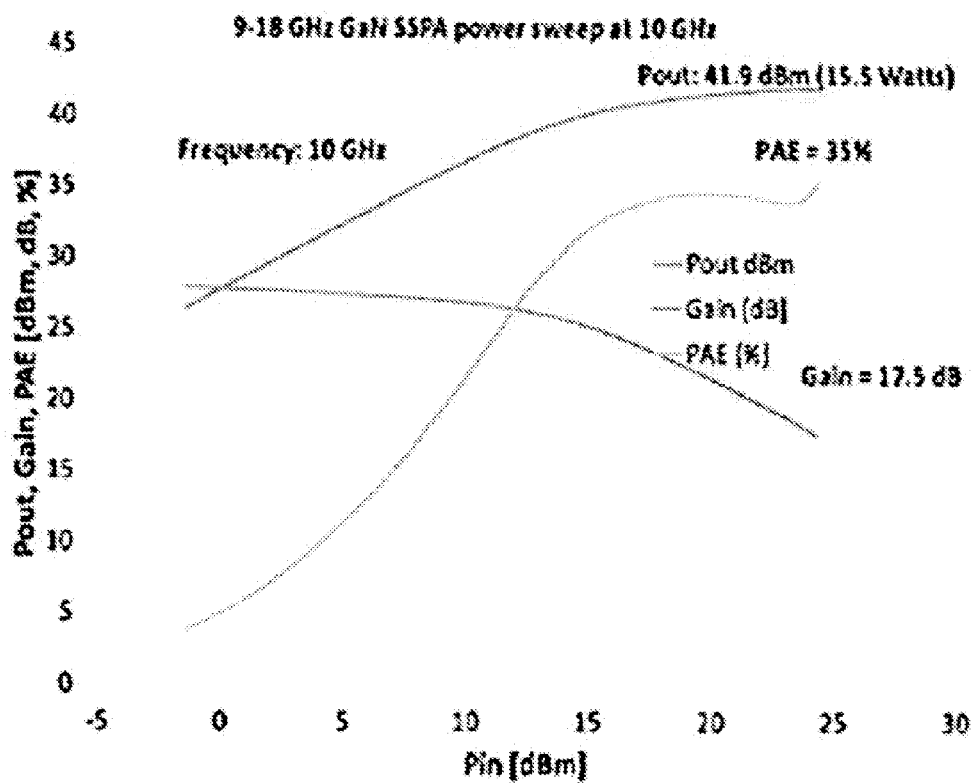
FIG. 7A illustrates an example of the performance of a power amplifier in response to receiving a large amplitude signal, in accordance with some embodiments.
Figure 7B:
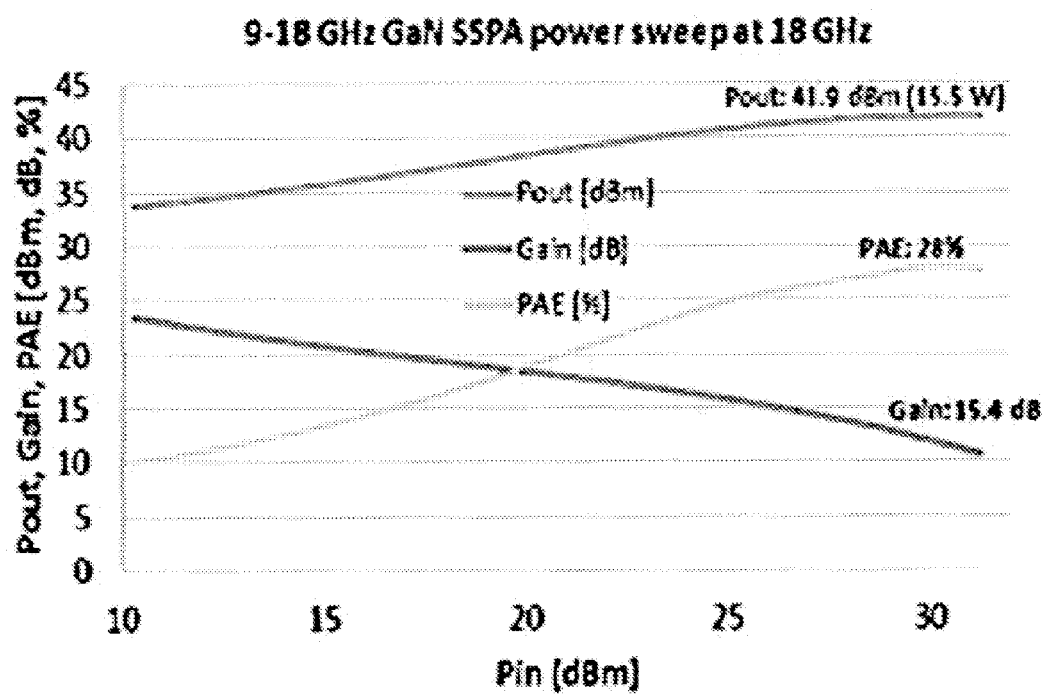
FIG. 7B illustrates another example of the performance of a power amplifier in response to receiving a large amplitude signal, in accordance with some embodiments.

FIG. 6 illustrates an example of performance of a power amplifier module in response to receiving a small amplitude signal, in accordance with some embodiments. As shown in the data plot of FIG. 6, the housing module of the power amplifier module suppresses resonances such that the power amplifier exhibits no resonance in the wideband operational range of 9-18 GHz. The power amplifier module also exhibits greater than 16 dB of gain as well as an excellent input and output match across the entire band. FIG. 7A and FIG. 7B illustrate examples of the performance of a power amplifier module in response to receiving a large amplitude signal, in accordance with some embodiments. As shown in the data plot in FIG. 7A, at 10 GHz, the power amplifier module had 15.5 W of output power with a power gain of 17.5 dB and 35% power added efficiency. As shown in the data plot of FIG. 7B, at 18 GHz, the power amplifier module had 15.5 W of output power with a power gain of 15.4 dB and 28% power added efficiency. Thus, the data plots illustrated in FIG. 6, FIG. 7A, and FIG. 7B demonstrate how the power amplifier module exhibits resonance free operation across a wideband of frequencies, and consistently and efficiently provides a large power output.

Figure 8:
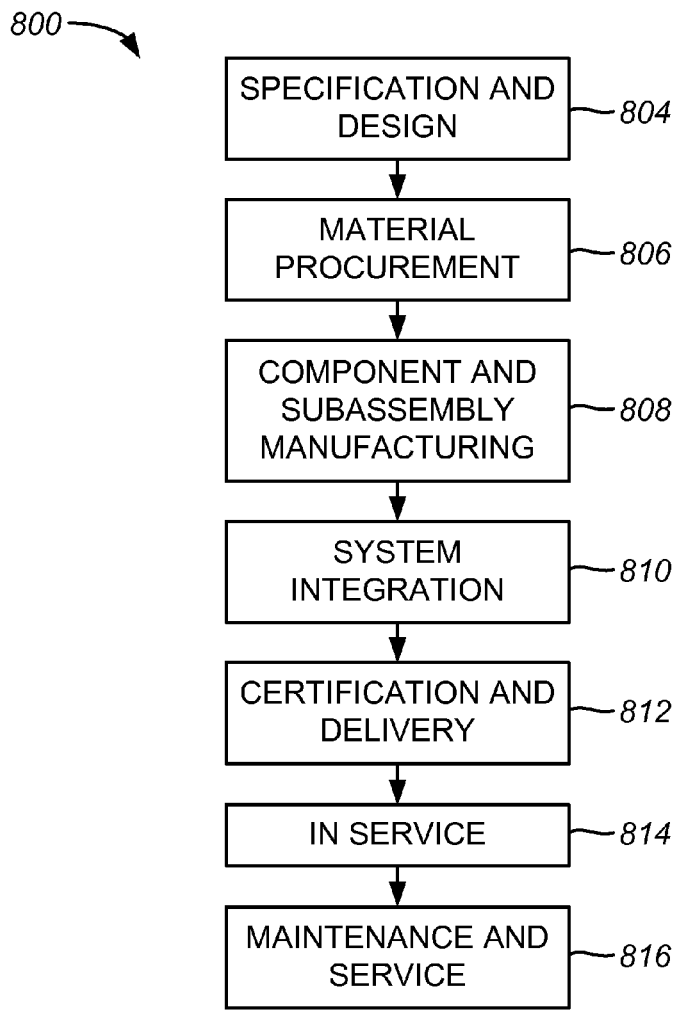
FIG. 8 illustrates a flow chart of an example of an aircraft production and service methodology, in accordance with some embodiments.
Figure 9:
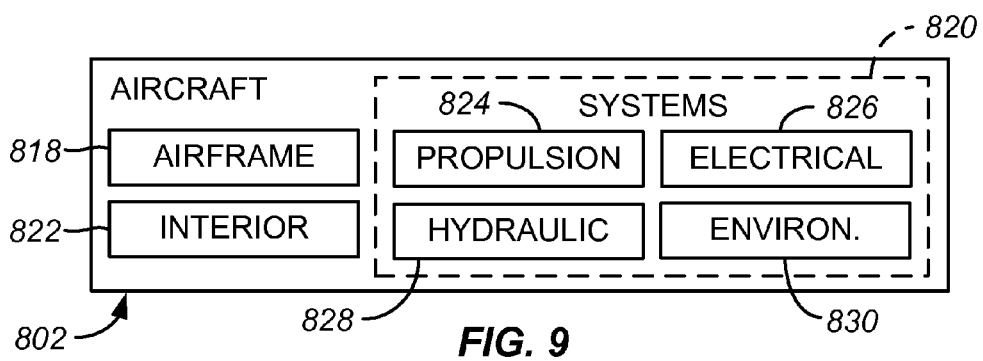
FIG. 9 illustrates a block diagram of an example of an aircraft, in accordance with some embodiments.

Embodiments of the disclosure may be described in the context of an aircraft manufacturing and service method 800 as shown in FIG. 8 and an aircraft 802 as shown in FIG. 9. During pre-production, illustrative method 800 may include specification and design 804 of the aircraft 802 and material procurement 806. During production, component and subassembly manufacturing 808 and system integration 810 of the aircraft 802 takes place. Thereafter, the aircraft 802 may go through certification and delivery 812 in order to be placed in service 814. While in service by a customer, the aircraft 802 is scheduled for routine maintenance and service 816 (which may also include modification, reconfiguration, refurbishment, and so on).

Each of the processes of method 800 may be performed or carried out by a system integrator, a third party, and/or an operator (e.g., a customer). For the purposes of this description, a system integrator may include without limitation any number of aircraft manufacturers and major-system subcontractors; a third party may include without limitation any number of venders, subcontractors, and suppliers; and an operator may be an airline, leasing company, military entity, service organization, and so on.

As shown in FIG. 9, the aircraft 802 produced by illustrative method 800 may include an airframe 818 with a plurality of systems 820 and an interior 822. Examples of high-level systems 820 include one or more of a propulsion system 824, an electrical system 826, a hydraulic system 828, and an environmental system 830. Any number of other systems may be included. Although an aerospace example is shown, the principles of the invention may be applied to other industries, such as the automotive industry.

Apparatus and methods embodied herein may be employed during any one or more of the stages of the production and service method 800. For example, components or subassemblies corresponding to production process 808 may be fabricated or manufactured in a manner similar to components or subassemblies produced while the aircraft 802 is in service. Also, one or more apparatus embodiments, method embodiments, or a combination thereof may be utilized during the production stages 808 and 810, for example, by substantially expediting assembly of or reducing the cost of an aircraft 802. Similarly, one or more of apparatus embodiments, method embodiments, or a combination thereof may be utilized while the aircraft 802 is in service, for example and without limitation, to maintenance and service 816.

Although the foregoing concepts have been described in some detail for purposes of clarity of understanding, it will be apparent that certain changes and modifications may be practiced within the scope of the appended claims. It should be noted that there are many alternative ways of implementing the processes, systems, and apparatus. Accordingly, the present examples are to be considered as illustrative and not restrictive.

What is claimed is:

1. A wideband power amplifier module comprising:
   an input port configured to receive an input signal for transmission from a platform;
   a first amplification stage of the wideband power amplifier module, the first amplification stage comprising a first plurality of amplification circuits comprising monolithic microwave integrated circuits (MMICs);
   a first plurality of couplers configured to couple the input port to each amplification circuit of the first amplification stage;
   a second amplification stage of the wideband amplifier module, the second amplification stage comprising a second plurality of amplification circuits comprising MMICs;
   a second plurality of couplers configured to couple the first amplification stage to the second amplification stage;
   a plurality of bias lines configured to have top surfaces that are aligned with top surfaces of the first plurality of amplification circuits and the second plurality of amplification circuits;
   a third plurality of couplers configured to combine an output of each amplification circuit of the second plurality of amplification circuits into an output signal, the third plurality of couplers comprising one or more Lange couplers; and
   an output port configured to receive the output signal generated by the third plurality of couplers and further configured to provide the output signal to a transmission device of the platform.

2. The wideband power amplifier module of claim 1, wherein the first amplification stage comprises four amplification circuits, and wherein the second stage comprises eight amplification circuits.

3. The wideband power amplifier module of claim 1, wherein the first amplification stage, the first plurality of couplers, the second amplification stage, the second plurality of couplers, and the third plurality of couplers collectively have a bandwidth of 9 gigahertz to 18 gigahertz.

4. The wideband power amplifier module of claim 1, Wherein the first plurality of couplers and the second plurality of couplers comprise Lange couplers, and wherein an isolation port of each Lange coupler is coupled to an electrical ground via a resistor, and is configured to absorb a signal reflection.

5. The wideband power amplifier module of claim 1, wherein the first amplification stage, the first plurality of couplers, the second amplification stage, the second plurality of couplers, and the third plurality of couplers are included in a housing module, wherein the housing module comprises a package and a lid, and wherein the housing module is configured to absorb parasitic resonances and thermal energy associated with the wideband power amplifier.

6. The wideband power amplifier module of claim 5, wherein a first top surface of the first amplification stage and a second top surface of the second amplification stage are implemented at the same height within the housing module.

7. The wideband power amplifier module of claim 5, further comprising:
   a first bias board configured to bias the first amplification stage;
   a first conductive board implemented above the first bias board;
   a second bias board configured to bias the second amplification stage; and
   a second conductive board implemented above the second bias board, wherein the first plurality of couplers is implemented above the first conductive board, and wherein the second plurality of couplers is implemented above the second conductive board.

8. The wideband power amplifier module of claim 7, wherein the first conductive board and the second conductive board are comprised of a material selected from the group consisting of: alumina, quartz, and silicon,
   and wherein the first conductive board and the second conductive board each have a thickness of 500 microns.

9. The wideband power amplifier module of claim 5, wherein the housing module is made of a material selected from the group consisting of a controlled expansion (CE) alloy, a copper-tungsten alloy, copper, aluminum silicon carbide, and aluminum.

10. The wideband power amplifier module of claim 1, wherein the input port is coupled to a radar or communications antenna of an airplane, and wherein the input signal is received from the radar or communications antenna of the airplane.

11. The wideband power amplifier module of claim 1, wherein omission device is an antenna of an airplane.

12. A method for wideband power amplification, the method comprising:
   receiving an input signal at an input port of a wideband power amplifier module;
   providing the input signal to a first amplification stage comprising a first plurality of amplification circuits comprising monolithic microwave integrated circuits (MMICs), the input signal being provided to each amplification circuit of the first plurality of amplification circuits;
   generating a first plurality of amplified signals by amplifying the input signal by a first gain;
   providing the first plurality of amplified signals to a second amplification stage comprising a second plurality of amplification circuits comprising MMICs, the first and second amplification stages being associated with a plurality of bias lines having top surfaces that are aligned with top surfaces of the first and second amplification stages, an amplified signal of the first plurality of amplified signals being provided to each amplification circuit of the second plurality of amplification circuits;
   generating a second plurality of amplified signals by amplifying the first plurality of amplified signals by a second gain; and
   generating an output signal by combining the second plurality of amplified signals into a single output signal via Lange couplers.

13. The method of claim 12, wherein Lange couplers are used to provide the input signal to the first amplification stage and to provide the first plurality of amplified signals to the second amplification stage.

14. The method of claim 13, wherein the Lange couplers are implemented on a plurality of conductive boards comprised of a material selected from the group consisting of: alumina, quartz, and silicon.

15. The method of claim 13 further comprising:
providing the output signal to an antenna via an output port.

16. The method of claim 15 further comprising:
receiving a reflected signal at the output port; and
using at least one Lange coupler to absorb the reflected signal.

17. A system for wideband power amplification of a signal transmitted from an airplane, the system comprising:
a transmission device configured to generate an input signal for transmission from the airplane;
an input port configured to receive the input signal generated by the transmission device;
a first amplification stage of a wideband power amplifier module, the first amplification stage comprising a first plurality of amplification circuits comprising monolithic microwave integrated circuits (MMICs);
a first plurality of couplers configured to couple the input port to each amplification circuit of the first amplification stage;
a second amplification stage of the wideband amplifier module, the second amplification stage comprising a second plurality of amplification circuits comprising MMICs;
a second plurality of couplers configured to couple the first amplification stage to the second amplification stage;
a plurality of bias lines configured to have top surfaces that are aligned with top surfaces of the first plurality of amplification circuits and the second plurality of amplification circuits;
a third plurality of couplers configured to combine an output of each amplification circuit of the second plurality of amplification circuits into an output signal, the third plurality of couplers comprising one or more Lange couplers;
an output port configured to receive the output signal generated by the third plurality of couplers; and
an antenna coupled to the output port and configured to transmit the output signal from the airplane.

18. The system of claim 17, wherein the first plurality of couplers and the second plurality of couplers comprise Lange couplers, wherein an isolation port of each Lange coupler is coupled to an electrical ground via a resistor, and wherein the first amplification stage, the first plurality of couplers, the second amplification stage, the second plurality of couplers, and the third plurality of couplers collectively have a bandwidth of 9 gigahertz to 18 gigahertz.

19. The system of claim 17, wherein the first amplification stage, the first plurality of couplers, the second amplification stage, the second plurality of couplers, and the third plurality of couplers are included in a housing module, wherein the housing module comprises a package and a lid, wherein the housing module is configured to absorb parasitic capacitances and thermal energy associated with the wideband power amplifier module, and wherein a first top surface of the first amplification stage and a second top surface of the second amplification stage are implemented at the same height within the housing module.

20. The system of claim 17, further comprising:
a first bias board configured to bias the first amplification stage;
a first conductive board implemented above the first bias board;
a second bias board configured to bias the second amplification stage; and
a second conductive board implemented above the second bias board, wherein the first plurality of couplers is implemented above the first conductive board, and wherein the second plurality of couplers is implemented above the second conductive board.

* * * * *